US012732752B2

(12) United States Patent
Stidsen et al.

(10) Patent No.: US 12,732,752 B2
(45) Date of Patent: Sep. 8, 2026

(54) SYSTEMS AND METHODS FOR SYNCHRONIZING AND RENDERING AUDIO SIGNALS VIA AN AUXILIARY SYNCHRONIZATION BACK CHANNEL

(71) Applicant: Lenbrook Industries Limited, Pickering (CA)

(72) Inventors: Gregory R. Stidsen, Andover, MA (US); Jens Torben Sonderskov, Toronto (CA)

(73) Assignee: Lenbrook Industries Limited, Pickering (CA)

( * ) Notice: Subject to any disclaimer, the term of this patent is extended or adjusted under 35 U.S.C. 154(b) by 0 days.

(21) Appl. No.: 19/288,554

(22) Filed: Aug. 1, 2025

(65) Prior Publication Data

US 2026/0040004 A1 Feb. 5, 2026

Related U.S. Application Data

(60) Provisional application No. 63/678,261, filed on Aug. 1, 2024.

(51) Int. Cl.

| | |
|---|---|
| ***G06F 3/16*** | (2006.01) |
| ***H03F 3/183*** | (2006.01) |
| ***H04R 3/12*** | (2006.01) |

(52) U.S. Cl.

CPC ............... *H04R 3/12* (2013.01); *G06F 3/162* (2013.01); *H03F 3/183* (2013.01); *H03F 2200/03* (2013.01); *H04R 2420/07* (2013.01)

(58) Field of Classification Search

CPC ....... H04R 3/12; H04R 2420/07; G06F 3/162; H03F 3/183; H03F 2200/03

See application file for complete search history.

(56) References Cited

U.S. PATENT DOCUMENTS

| | | | |
|---|---|---|---|
| 9,160,519 B1 * | 10/2015 | Leong .................. | H04W 12/06 |
| 2006/0287746 A1 | 12/2006 | Braithwaite et al. | |

(Continued)

FOREIGN PATENT DOCUMENTS

| | | |
|---|---|---|
| EP | 3220660 A1 | 9/2017 |
| WO | WO-2007/076575 A1 | 7/2007 |

OTHER PUBLICATIONS

Adame, "Time-Sensitive Networking in IEEE 802.11be: On the Way to Low-Latency WiFi 7," Sensors 21 (2021): 4954 (20 pages).

(Continued)

*Primary Examiner* — Joseph Saunders, Jr.

(74) *Attorney, Agent, or Firm* — Foley Hoag LLP; Erik A. Huestis; Emily H. Yasharpour

(57) ABSTRACT

Methods, systems, and computer program products are presented herein for rendering synchronous audio using audio rendering devices. A networked audio rendering device may include a first wireless communications module, a second wireless communications module, a microcontroller, at least one speaker driver, and at least one digital audio amplifier. Audio data may be received by a first wireless communications module. Timecode data may be received by a second wireless communications module operating at a sub-GHz ISM band. The audio data may be received by a microcontroller. The audio data is processed by the microcontroller to generate output audio signals based on the timecode data. The output audio signals may be amplified by at least one digital audio amplifier. At least one speaker driver may be driven, by the at least one digital audio amplifier, to render an audio output.

25 Claims, 4 Drawing Sheets

(56) References Cited

U.S. PATENT DOCUMENTS

| | | | | |
|---|---|---|---|---|
| 2007/0087686 | A1* | 4/2007 | Holm | H04S 7/30<br>455/3.06 |
| 2007/0226530 | A1* | 9/2007 | Celinski | H04J 3/0664<br>713/500 |
| 2016/0309269 | A1 | 10/2016 | Peters et al. | |
| 2019/0158909 | A1 | 5/2019 | Kulkarni et al. | |
| 2021/0112106 | A1 | 4/2021 | McKenzie | |
| 2024/0430828 | A1* | 12/2024 | Qi | H04W 56/0015 |

OTHER PUBLICATIONS

Ferrari et al., "Timestamp Validation Strategy for Wireless Sensor Networks based on IEEE 802.15.4 CSS," IEEE Transactions on Instrumentation and Measurement (2014): 11 pages.

International Search Report and Written Opinion for International Application No. PCT/US25/40313 dated Oct. 14, 2025.

Lord Technical Note, "LXRS® and LXRS+ Wireless Sensor Protocol," Document 8401-0084 Revision A (2017): 6 pages.

Seijo et al., "w-SHARP: Implementation of a High-Performance Wireless Time-Sensitive Network for Low Latency and Ultra-Low Cycle Time Industrial Applications," IEEE Transactions on Industrial Informatics 17(5) (2020): 3651-3662.

Shani, "Texas Instruments Application Report: Precise Time Synchronization over WLAN," SWAA162A (2015): 15 pages.

Yu et al., "Crocs: Cross-Technology Clock Synchronization for WiFi and ZigBee," International Conference on Embedded Wireless Systems and Networks (EWSN) 2018: 135-144.

Zanbouri et al., "A Comprehensive Survey of Wireless Time-Sensitive Networking (TSN): Architecture, Technologies, Applications, and Open Issues," arXiv 2312.01204v1 (2023): 19 pages.

* cited by examiner

SYSTEMS AND METHODS FOR SYNCHRONIZING AND RENDERING AUDIO SIGNALS VIA AN AUXILIARY SYNCHRONIZATION BACK CHANNEL

CROSS-REFERENCE TO RELATED APPLICATIONS

This application claims the benefit of U.S. Provisional Application No. 63/678,261 filed Aug. 1, 2024, which is hereby incorporated by reference in its entirety.

BACKGROUND OF THE DISCLOSED SUBJECT MATTER

Field of the Disclosed Subject Matter

The disclosed subject matter relates to synchronizing audio signals. Particularly, the present disclosed subject matter is directed to synchronizing and rendering two or more correlated audio signals.

Description of Related Art

Synchronizing the clocks of multiple wireless audio rendering devices, such as wireless speakers, may be used for the synchronous playback of audio content. Current wireless communications connection methods compliant with the WiFi standard may synchronize the system clocks of each of multiple audio rendering devices, interconnected via the wireless connection, to a limited degree with established network software standards. In addition, although current implementations of audio rendering devices interconnected by a wire may achieve a greater degree of synchronization precision than those implementations with devices interconnected wirelessly, there may be several drawbacks to such implementations. For example, such wired implementations may be costly and may not be suited for all operating environments, such as in environments with obstructions where wired implementations are not possible. Synchronization precisions of the degree (or of a greater degree) achievable in such wired implementations of audio rendering devices may not be achievable with conventional wireless audio rendering devices. In addition, because of inter-channel clock or phase drift, conventional wired or wireless implementations of audio rendering devices may not achieve synchronous playback of high-resolution audio, and such implementations may also be unreliable for sustained synchronous audio playback at any resolution of the audio.

Therefore, there is a need to release reliable, fully wireless, high-resolution audio rendering devices and related techniques capable of rendering two or more channels of audio data streams that are synchronized (i.e., without perceptible inter-channel clock or phase drift), in a wide variety of operating environments, and at a low cost.

SUMMARY OF THE DISCLOSED SUBJECT MATTER

The purpose and advantages of the disclosed subject matter will be set forth in and apparent from the description that follows, as well as will be learned by practice of the disclosed subject matter. Additional advantages of the disclosed subject matter will be realized and attained by the methods and systems particularly pointed out in the written description and claims hereof, as well as from the appended drawings.

To achieve these and other advantages and in accordance with the purpose of the disclosed subject matter, as embodied and broadly described, the disclosed subject matter includes a networked audio rendering device that includes a first wireless communications module, a second wireless communications module, a microcontroller, at least one speaker driver, and at least one digital audio amplifier. The first wireless communications module is configured to receive audio data. The second wireless communications module is configured to receive timecode data. The second wireless communication module operates at a sub-GHz ISM band. The microcontroller is configured to receive and process the audio data to generate output audio signals based on the timecode data. The first wireless communications module and the second wireless communications module are electrically coupled to the microcontroller. The at least one digital audio amplifier is configured to amplify the output audio signals, and drive the at least one speaker driver to render an audio output. The at least one digital audio amplifier is electrically coupled to the microcontroller and the at least one speaker driver.

The disclosed subject matter also includes a system for rendering synchronized audio output that includes a first audio rendering device and a second audio rendering device. The first audio rendering device that is configured to render a first audio output, and that includes a first wireless communications module, a second wireless communications module, a first microcontroller, at least one first speaker driver, and at least one first digital audio amplifier. The second audio rendering device that is configured to render a second audio output, and that includes a third wireless communications module, a fourth wireless communications module, a second microcontroller, at least one second speaker driver, and at least one second digital audio amplifier. The first wireless communications module is configured to receive first audio data. The second wireless communications module is configured to send timecode data. The second wireless communication module operates at a sub-GHz ISM band. The first microcontroller is configured to receive and process the first audio data to generate first output audio signals. The first wireless communications module and the second wireless communications module are electrically coupled to the first microcontroller. The at least one first digital audio amplifier is configured to amplify the first output audio signals, and drive the at least one first speaker driver to render the first audio output. The at least one first digital audio amplifier is electrically coupled to the first microcontroller and the at least one first speaker driver. The third wireless communications module is configured to receive second audio data. The fourth wireless communications module is configured to receive the timecode data from the second wireless communications module. The fourth wireless communication module operates at a sub-GHz ISM band. The second microcontroller is configured to receive and process the audio data to generate second output audio signals based on the timecode data. The third wireless communications module and the fourth wireless communications module are electrically coupled to the second microcontroller. The at least one second digital audio amplifier is configured to amplify the second output audio signals, and drive the at least one second speaker driver to render the second audio output, wherein the first audio output and the second audio output are synchronized. The at least one second digital audio amplifier is electrically coupled to the second microcontroller and the at least one second speaker driver.

The disclosed subject matter also includes a method of rendering synchronized audio output. Audio data is received by a first wireless communications module. Timecode data is received by a second wireless communications module operating at a sub-GHz ISM band. The audio data is received by a microcontroller. The audio data is processed by the microcontroller to generate output audio signals based on the timecode data. The output audio signals are amplified by at least one digital audio amplifier. At least one speaker driver is driven, by the at least one digital audio amplifier, to render an audio output.

It is to be understood that both the foregoing general description and the following detailed description are exemplary and are intended to provide further explanation of the disclosed subject matter claimed.

The accompanying drawings, which are incorporated in and constitute part of this specification, are included to illustrate and provide a further understanding of the method and system of the disclosed subject matter. Together with the description, the drawings serve to explain the principles of the disclosed subject matter.

BRIEF DESCRIPTION OF THE DRAWINGS

A detailed description of various aspects, features, and embodiments of the subject matter described herein is provided with reference to the accompanying drawings, which are briefly described below. The drawings are illustrative and are not necessarily drawn to scale, with some components and features being exaggerated for clarity. The drawings illustrate various aspects and features of the present subject matter and may illustrate one or more embodiment(s) or example(s) of the present subject matter in whole or in part.

DETAILED DESCRIPTION

Reference will now be made in detail to exemplary embodiments of the disclosed subject matter, an example of which is illustrated in the accompanying drawings. The method and corresponding steps of the disclosed subject matter will be described in conjunction with the detailed description of the system.

The methods, systems, devices, and computer program products presented herein may be used for synchronizing and rendering audio signals, using audio rendering devices, which may make use of an auxiliary synchronization back channel to perform the synchronization. The techniques described herein may allow the audio signals rendered by the time-synchronized audio rendering devices to be synchronized within a small margin of difference of each other (e.g., a difference in phase between the signals). For example, the small margin of difference may be as low as 200 ns (or lower, such as no margin of difference). Such a margin of difference can support high-resolution audio playback. In addition, such a small difference of phase between the rendered audio signals may be relatively imperceptible to a listener/user of the audio rendering devices.

Figure 1:
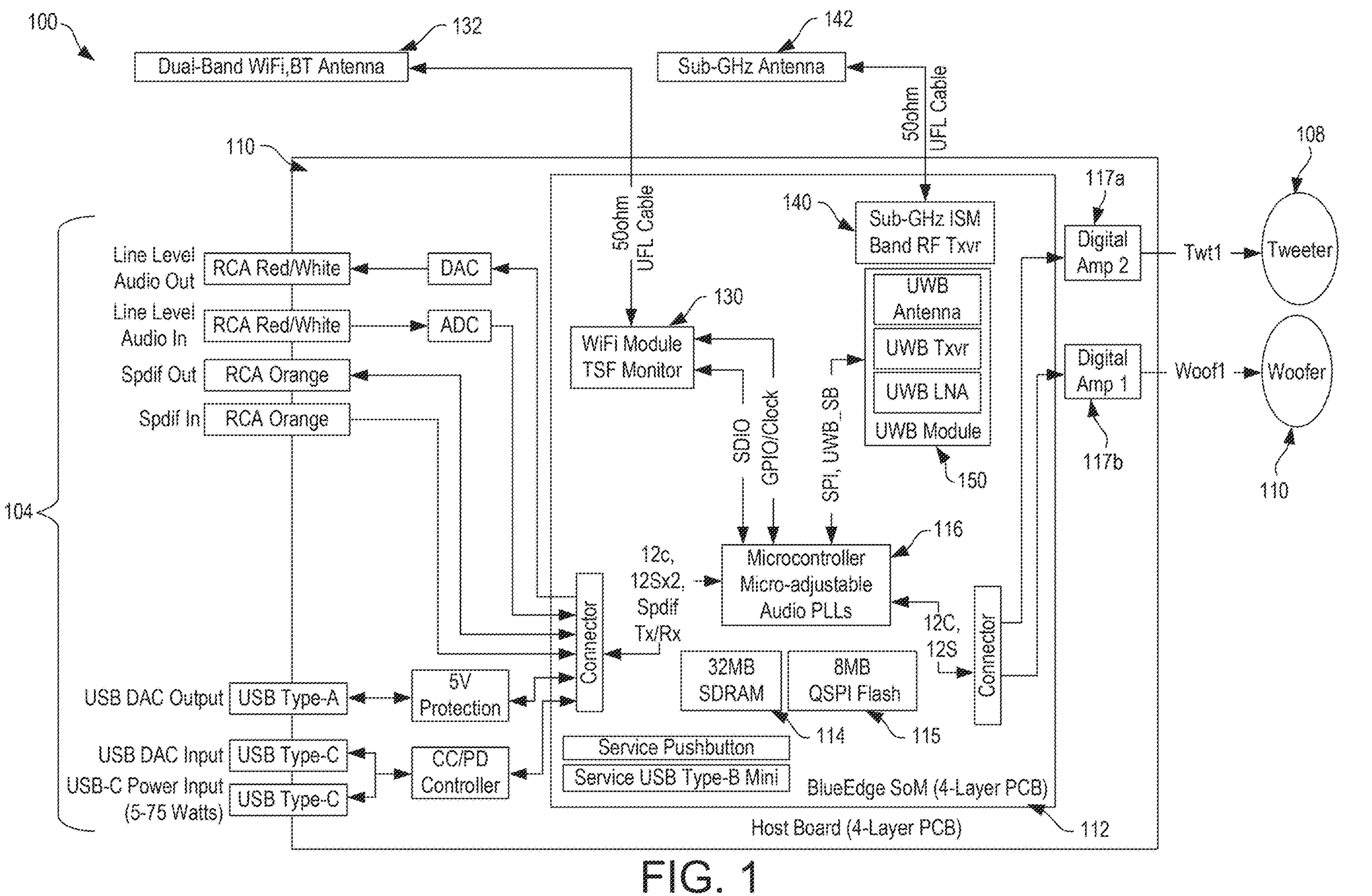
FIG. 1 depicts a simplified block diagram illustrating components of an audio rendering device in accordance with various embodiments.

For purposes of explanation and illustration, and not limitation, an example embodiment of the system in accordance with the disclosed subject matter is shown in FIG. 1 and is designated generally by reference character 100. Similar reference numerals (differentiated by the leading numeral) may be provided among the various views and Figures presented herein to denote functionally corresponding, but not necessarily identical, structures.

FIG. 1 depicts a simplified block diagram illustrating various components of an audio rendering device 100 in accordance with various embodiments.

In various embodiments, audio rendering device 100 may be disposed within a housing (not shown). In various embodiments, audio rendering device 100 may include a host board 110 in the housing. In various embodiments, the host board may include one or more Radio Corporation of America (RCA) input and/or output and/or one or more Sony/Philips Digital Interconnect Format (S/PDIF) input and/or output, which may each be connected via an analog-to-digital converter (ADC), via a digital-to-analog converter (DAC), or directly to a connector on a System-on-Module (SOM) 112. For example, audio rendering device 100 may include one or more RCA input, which may be connected to an ADC to a connector on SOM 112. As another example, audio rendering device 100 may include one or more RCA output, which may be connected to a DAC to a connector on SOM 112. As yet another example, audio rendering device 100 may include one or more S/PDIF input and output directly connected to a connector on SOM 112.

In various embodiments, host board 110 may include one or more type of USB input and/or output, which may each be connected via a 5V protection module, and/or a PD-PHY and CC-Logic Controller, or directly to a connector for a SOM 112. For example, audio rendering device 100 may include one or more USB Type-A output, which may be connected via a 5V protection module to a connector on SoM 112. For example, audio rendering device 100 may include one or more USB Type-C input or output, which may be connected via a PD-PHY and CC-Logic Controller to a connector on SoM 112. In various embodiments, this connector may communicate input and/or output signals to and from microcontroller 116 via one or more $I^2C$ and/or $I^2S$ bus. In various embodiments, one or more USB input, such as a USB Type-C input, may be used to receive power (e.g., between 5 and 75 Watts of power), which may be provided to PD-PHY and CC-Logic Controller, which may then provide power to the SOM, its components, such as microcontroller 116, and/or any other components within audio rendering device 100.

In various embodiments, audio rendering device 100 may include one or more speaker drivers. For example, the speaker drivers may include a tweeter 108 and a woofer 110.

In various embodiments, one or more SoM 112, which is a small form-factor computing hardware module, may be included on host board 110 in the housing. A SOM may include, among other things, a microcontroller 116, random access memory (RAM) 114 for run-time data storage (e.g., 32 MB of SDRAM storage), flash memory 115 for non-volatile storage of software program instructions needed for power-on booting and for the execution of applications (e.g., 8 MB of QSPI Flash storage), and connectors to allow the SOM to interface with input(s), output(s), and digital amplifiers, such as digital amplifiers 117*a* and 117*b*. In various embodiments, flash memory 115 may also allow for storage or 'caching' of music.

In various embodiments, SOM 112 may include a microcontroller 116. Microcontroller 116 may include one or more processors and/or cores, such as advanced RISC machine (ARM) processors, executing an operating system, such as the Linux operating system. In various embodiments, microcontroller 116 may include hardware accelerators to implement one or more machine learning models. The use of such a design, including SOM 112, may make the task of programming and setting up audio rendering device 100 significantly more accessible, and may make the cost of the hardware and software development for audio rendering device 100 significantly lower than conventional DSP/MCU-based AVR architectures.

In various embodiments, a SOM-based architecture with microcontroller 116 may allow the use of proven and standard software libraries, such as audio-related software libraries, or libraries for user-friendly graphics for possible display on a display (not shown) included with the audio rendering device 100. Such an architecture may also allow support for different operating systems, such as the BluOS™ audio operating system available from Lenbrook™, which can allow for the use of Internet music services by the audio rendering device 100. BluOS™ can facilitate connections to iOS™ and/or Android™ devices running a BluOS™ software app, which users can install on their mobile device. This app may wirelessly connect a user's mobile device to a network that includes audio rendering device 100. For example, the app may use a discovery software mechanism, such as the Simple Service Discovery Protocol (SSDP), multicast Domain Name System (mDNS), or the Lenbrook™ Service Discovery Protocol (LSDP), to automatically 'discover' audio rendering device 100. This app may allow users to easily select high-resolution music for playback across one or more audio rendering device 100 connected to the network. Microcontroller 116 together with such an app can allow a user of the audio rendering device 100 to quickly search and select for playback any of thousands of songs or radio streams available either from Internet music services or local music libraries stored on music servers connected to the same network as the audio rendering device 100.

In various embodiments, microcontroller 116 may be configured to receive and process audio data to generate output audio signals. In various embodiments, microcontroller 116 may include and control a hardware crystal clock source and one or more phase-locked-loop (PLL). Microcontroller 116 may receive audio data from WiFi module 130, UWB module 150, or another audio input to audio rendering device 100. Microcontroller 116 may process this data to render it for output from the audio rendering device 100 based on its clock source and/or the output frequency of its one or more PLLs. Audio rendering device 100 may include a hardware crystal clock source.

In various embodiments, the output audio signals may be provided to digital audio amplifiers 117*a* and 117*b* via a connector included on the SOM 112. In various embodiments, the connector may communicate signals to and from microcontroller 116 via one or more $I^2C$ and/or $I^2S$ bus. Microcontroller 116 may analyze and respond to inputs in real-time or near real-time.

In various embodiments, digital audio amplifiers 117*a* and 117*b* may amplify the output audio signals received from microcontroller 116 to drive the tweeter 108 and woofer 110 to render an audio output. In various embodiments, digital amplifiers 117*a* and 117*b* may be used to increase power efficiency to maximize utilization.

In various embodiments, the processing capacity of one or more processors and/or cores included in microcontroller 116, along with amplifiers 117*a* and 117*b*, may facilitate the processing of high-resolution ('HiRes') digital audio data streams, such as those available via music services on the Internet. Compact disc (CD) quality at 44.1 kHz sampling rate and 16 bits per sample ('bit depth') may be considered 'standard' digital resolution and high-resolution may be anything greater than this. The processing power included in microcontroller 116 along with amplifiers 117*a* and 117*b* can enable HiRes audio, as it can require four, eight, or more times the bandwidth of standard definition or 'compact disc' quality audio. For example, the microcontroller 116 and audio amplifiers 117*a* and 117*b* can support 4× the sampling (192 kHz) rate and 1.3× the bit depth (24 bits) of a CD. Analogous to High-Definition television, this extended HiRes audio data capacity can provide wide-band frequency response and extended dynamic range output audio drivers of the audio rendering device speakers. As another example, high-resolution audio can support 8× the sampling (384 kHz) rate of a CD. This HiRes audio can also include emerging, specialty high-resolution audio formats, which may include further post-processing to fully authenticate and render this format.

In various embodiments, the SOM 112 may include a WiFi communications module 130, which may also be referred to as a WiFi transceiver. In various embodiments, WiFi communications module 130 may be connected to an antenna 132, such as a dual-band WiFi and/or Bluetooth (BT) antenna. Antenna 132 may receive WiFi or BT RF signals and may provide these signals to WiFi communications module 130 for processing. WiFi communications module 130 and antenna 132 may allow audio rendering device 100 to connect, using a WiFi connection, to a wireless local area network (WLAN). WiFi communications module 130 and antenna 132 may allow audio rendering device 100 to communicate with other devices, such as other audio rendering devices and a WiFi router, and the Internet via the WLAN. In various embodiments, WiFi communications module 130 and antenna 132 may allow audio rendering device 100 to receive audio data from an audio source, such as the Internet.

In various embodiments, WiFi communications module 130 may be adapted to support the Network Time Protocol (NTP) and/or a Time Synchronization Function (TSF). NTP may be a software-based networking protocol for clock synchronization between devices, such as audio rendering devices, connected via a packet-switched, variable-latency, data network. In various embodiments, using NTP, a timestamp/timecode may be applied when an NTP packet is sent between WiFi communications module 130 and a corresponding WiFi router/WiFi access point to which it is connected on a WLAN, in either direction, and the time of the packet's reception at the other of the module or router may be recorded. A round-trip delay may be computed based on such timestamping and such reception time recording being performed in both directions (such as when an NTP packet is sent from the WiFi communications module to a corresponding WiFi router to which it is connected, and vice versa). The round-trip delay may be used, by microcontroller 116, to determine any local clock error and determine any adjustment needed to the local clock of the device corresponding to WiFi communications module 130, such as audio rendering device 100. In this way, NTP may be used to synchronize clocks of devices throughout a network, such as devices throughout the WLAN. Synchronization for devices, such as audio rendering devices, on the WLAN may be performed based on protocols similar to Time-Sensitive Networking (TSN) or wireless TSN. Time-Sensitive Networking (TSN) may be a set of standards and tools to facilitate real-time deterministic communications, and may be defined by IEEE 802.1, for synchronization of devices on a network. The TSN protocols may provide low latency and high reliability for device synchronization throughout the network. These protocols may use the precision time protocol (PTP) for device synchronization, and may easily be extended to a wireless network, such as a WLAN, where it may make use of the newest version of the PTP protocol, which is similar to NTP, but which may allow for hardware-based timestamping of packets.

Synchronization for devices, such as audio rendering devices, on the WLAN may be performed based on the Time Synchronization Function (TSF) in a similar way. In particular, a WiFi router/WiFi access point may be connected via antenna 132 to a WiFi communications module 130, on a WLAN. The WiFi router/WiFi access point may track its local clock, and may also track its local TSF counter, which it may automatically increment. WiFi communications module 130, on a WLAN, may track its device's local clock (e.g., the device's software system clock time), and may also track its device's local TSF counter, which it may automatically increment. The WiFi router/WiFi access point may periodically broadcast packets, such as timestamp beacon packets, that include TSF information, including its local clock and local TSF counter. This TSF information may be received by a WiFi antenna, such as antenna 132, and a WiFi communications module, such as WiFi communications module 130, at each device on the WLAN, such as devices similar in form and function to audio rendering device 100. The microcontroller, such as microcontroller 116, in each receiving device, such as a device similar in form and function to audio rendering device 100, can use this TSF-related information, as well as information regarding its device's local clock and local TSF counter, to determine any local clock error and determine any adjustment/compensation needed to the local clock of the respective receiving device to compensate for any hardware crystal frequency drift. In this way, TSF may be used to synchronize clocks of devices throughout a network, such as devices throughout the WLAN. In various embodiments, the TSF functionality of the WiFi router/WiFi access point, such as sending timestamp beacon packets, may be performed by one audio rendering device (e.g., a primary device) of multiple audio rendering devices operating on the WLAN. Such an audio rendering device may communicate the TSF information with one or more other audio rendering devices (e.g., secondary devices) operating on the WLAN. The TSF functionality may be found in multiple versions of WiFi, such as WiFi-6 and WiFi-7.

NTP, TSN, and/or TSF operating on the devices may provide clock synchronization to an error with a lower bound of 1 μs among the devices via the WiFi network. In practice, WiFi networks using TSF and using TSF packets can sync device clocks to within 10-50 μs of each other, which may, in some instances, be insufficient for synchronous HiRes audio playback.

In various embodiments, SOM 112 may include ultra-wideband (UWB) communications module 150, which may also be referred to as a UWB transceiver unit. In various embodiments, UWB communications module 150 may include a UWB antenna, a UWB transceiver, and a UWB low-noise amplifier (LNA). The UWB antenna may receive UWB signals, may provide these signals to the UWB LNA, which may provide these signals to the UWB transceiver and/or a microcontroller, such as microcontroller 116, for processing. UWB communications module 150 may allow audio rendering device 100 to connect, using a UWB connection, to a wireless local area network (WLAN). UWB communications module 150 may allow audio rendering device 100 to communicate with other devices, such as other audio rendering devices, and the Internet via the WLAN. In various embodiments, UWB communications module 150 may allow audio rendering device 100 to receive audio data from an audio source, such as the Internet.

In various embodiments, multiple audio rendering devices, such as those similar in form and function to audio rendering device 100, and operating on the same network, such as the same WLAN, may play an audio stream in synchrony. In various embodiments, this may be implemented by setting a real-time clock in each such audio rendering device to a common source clock through NTP and/or TSF and compensating for differences among the hardware crystal clock sources, each of which is installed in an audio rendering device. If a real-time clock of an audio rendering device, such as audio rendering device 100, is measured, by its microcontroller, such as microcontroller 116, to be advancing faster (or slower) than that of another audio rendering device (or of the WiFi router/WiFi access point), its clock rate may be reduced (or sped up) proportionally (to more closely match the clock rate of the other audio rendering device) by having its microcontroller gradually adjust the audio rendering device's PLL output frequency. The microcontroller may then adjust (e.g., delay or speed up) and provide output audio signals, based on this adjusted PLL output frequency, to digital audio amplifiers, such as digital audio amplifiers 117*a* and 117*b*. These amplifiers may each amplify its received signals to drive a tweeter and/or woofer, such as tweeter 108 and woofer 110.

In various embodiments, the SOM 112 may include a Sub-GHz ISM band RF communications module transceiver 140, which may be referred to as a Sub-GHz ISM band transceiver. In various embodiments, Sub-GHz ISM band RF communications module transceiver 140 may be connected to an antenna 142, such as a Sub-GHz ISM band RF antenna. Antenna 142 may receive Sub-GHz ISM band RF signals and may provide these signals to Sub-GHz ISM band RF communications module transceiver 140 for processing. Sub-GHz ISM band RF communications module transceiver 140 and antenna 142 may allow audio rendering device 100 to directly connect, using a Sub-GHz ISM band connection, to the Sub-GHz ISM band RF communications module transceiver and antenna of one or more other audio rendering devices, such as another audio rendering device 100. The Sub-GHz ISM band connection between multiple devices may be referred to as a side-channel, a feedback channel, and/or an auxiliary synchronization back channel between the devices. The Sub-GHz ISM band connection between multiple devices may be referred to as a BluStrobe channel. The Sub-GHz ISM band connection between multiple such devices may allow for timestamps and/or timecodes to be sent directly between the devices.

In various embodiments, a Sub-GHz ISM band RF communications module transceiver 140 of a primary audio rendering device may track its local clock and may be clocked via its device's microcontroller 116. The primary audio rendering device may periodically produce and transmit a timestamp beacon packet, which includes a timestamp and/or timecode, which indicates its clock value, via its Sub-GHz ISM band RF communications module transceiver 140 and antenna 142. The timestamp beacon packet may be transmitted to and received by one or more secondary audio rendering devices, which may each be similar in form and function to audio rendering device 100. In particular, the primary audio rendering device may periodically directly transmit a timestamp beacon packet, via its Sub-GHz ISM band connection(s), to one or more secondary audio rendering devices.

The microcontroller, such as microcontroller 116, in each secondary audio rendering device, such as audio rendering device 100, can filter the timestamps and/or timecodes, which it receives from the primary audio rendering device. In this manner, the secondary audio rendering device may produce filtered timestamps and/or timecodes. For example, the microcontroller can eliminate timestamps and/or timecodes outside of averaged mean timestamp and/or timecode value, which may account for anomalies, such as those caused by multipath RF propagation delays.

The microcontroller, such as microcontroller 116, in each secondary audio rendering device, such as audio rendering device 100, can use the timestamps and/or timecodes and/or the filtered timestamps and/or timecodes to determine any local clock error and to determine any adjustment needed to the local clock of the respective receiving device. In this way, Sub-GHz ISM band connection may be used to synchronize clocks of devices throughout a network, such as devices throughout the WLAN.

The sub-GHz ISM band connection technique, described herein, may support synchronization of the device clocks of multiple audio rendering devices and audio signals rendered by the multiple audio rendering devices to around 200 ns of each other. The ISM band chips, which include sub-GHz ISM band and an antenna, may be of a low cost for implementation in consumer electronics, such as audio rendering devices.

Such a degree of time synchronization between multiple audio rendering devices, made possible by the sub-GHz ISM band connection technique described herein, may provide for the playback of multiple synchronized HiRes audio streams, each by an audio rendering device, such as audio rendering device 100. For context, the sampling period of HiRes audio at 192 kHz, as described above, may be 5 μs. For HiRes audio at 384 kHz, as described above, the sampling period may be 2.5 μs. Thus, the sub-GHz ISM band connection technique, described herein, may be able to achieve synchronized playback of HiRes audio content by multiple audio rendering devices, each being similar in form and function to audio rendering device 100.

As described herein, in various embodiments, multiple audio rendering devices, such as those similar in form and function to audio rendering device 100, and connected to each other via the Sub-GHz ISM band connection, may play an audio stream in synchrony. In various embodiments, this may be implemented by having a primary audio rendering device, similar in form and function to audio rendering device 100, send a timestamp and/or timecode to one or more secondary audio rendering device via the Sub-GHz ISM band connection. The secondary audio rendering device, similar in form or function to audio rendering device 100, may receive the timestamp and/or timecode from a primary audio rendering device via the Sub-GHz ISM band connection. The timestamp and/or timecode from such a secondary device may be compared to a timestamp and/or timecode of the primary device. Based on this comparison, if a real-time clock of a secondary audio rendering device, such as audio rendering device 100, is measured, by its microcontroller, such as microcontroller 116, to be advancing faster (or slower) than that of a primary audio rendering device, its audio clock rate may be reduced (or sped up) proportionally (to more closely match the clock rate of the primary audio rendering device) by having its microcontroller gradually adjust the secondary audio rendering device's PLL output frequency to more closely match that of the primary audio rendering device. The microcontroller may then adjust (e.g., delay or speed up) and provide output audio signals, based on this adjusted PLL output frequency, to digital audio amplifiers, such as digital audio amplifiers 117*a* and 117*b*. These amplifiers may each amplify its received signals to drive a tweeter and/or woofer, such as tweeter 108 and woofer 110.

In various embodiments, the outer housing (not shown) of the audio rendering device 100, such as an audio speaker, may include a polypropylene material. Polypropylene has advantages over wood, even weatherproof specialty wood materials that are often used in speaker housings. Polypropylene is inert at a molecular level. It may be unaffected by moisture and ultraviolet light, and may maintain a new appearance. It may remain dimensionally stable across a wide ambient temperature range. Polypropylene may also be much more thermally insulative than other non-wood materials such as polycarbonate. Polypropylene can be molded at much lower cost into two simple pieces for the entire housing. In various embodiments, the two polypropylene housing components may be fastened together with a single sealed seam. In various embodiments, the wall thickness of the polypropylene housing is about 6-11 mm to increase rigidity. The polypropylene also provides a higher damping of acoustic vibration and reduced distortion.

In various embodiments, woofer 110 and tweeter 108 components may be waterproof to provide longevity of the audio rendering device 100 in rugged installation environments.

Figure 2:
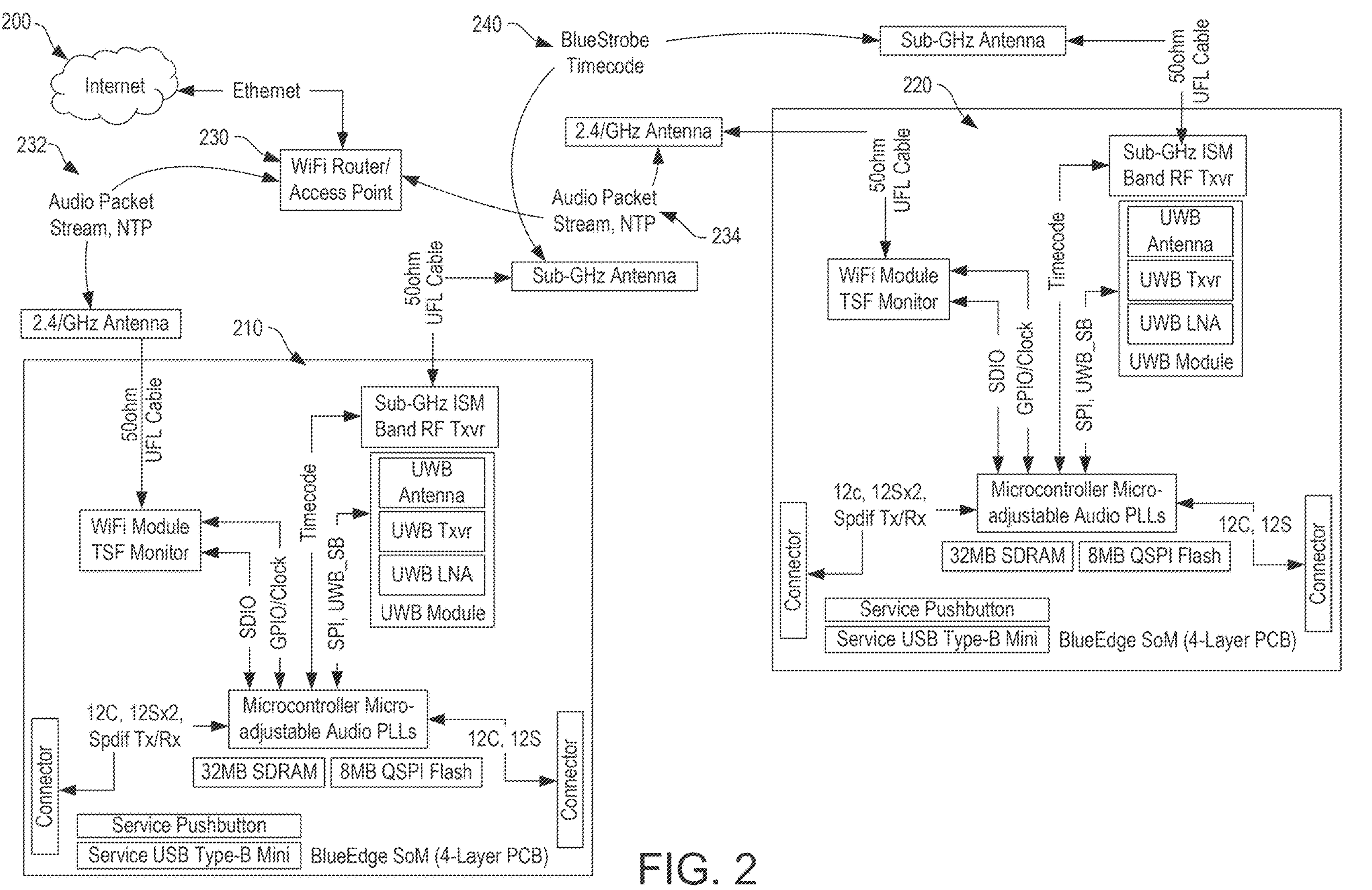
FIG. 2 depicts a simplified block diagram illustrating a system for synchronizing multiple audio rendering devices for audio playback in accordance with various embodiments.

FIG. 2 depicts a simplified block diagram illustrating a system 200 for synchronizing multiple audio rendering devices, such as audio rendering devices 210 and 220, for audio playback in accordance with various embodiments.

System 200 may include multiple audio rendering devices, such as audio rendering devices 210 and 220, each of which may be similar in form and function to audio rendering device 100, as discussed with relation to FIG. 1.

System 200 may include a WiFi router/WiFi Access Point 230. WiFi router 230 may provide standard wireless access to the Internet, via a wireless local area network (WLAN), to audio rendering devices 210 and 220. WiFi router 230 may communicate via message/packet streams 232 and 234 to and/or from audio rendering devices 210 and 220, respectively. In various embodiments, WiFi router 230 may send streams of messages/packets 232 and 234, which include audio data to the WiFi antenna, such as antenna 132, and WiFi communications module, such as WiFi communications module 130 of each of multiple audio rendering devices, such as audio rendering devices 210 and 220. These streams may be from an audio source, such as an audio source accessed via the Internet. Additionally, in various embodiments, WiFi router 230 may be adapted to support NTP and/or TSF. In particular, WiFi router 230 may communicate NTP and/or TSF information via messages/packets 232 and 234, as described above with relation to FIG. 1. WiFi router 230 may communicate this information to each of multiple audio rendering devices, such as audio rendering devices 210 and 220. In this way, NTP and/or TSF may be used to synchronize the clocks of the devices throughout a network, such as throughout the WLAN on which the devices operate.

System 200 may operate using message/packet stream 240 for communications between audio rendering devices 210 and 220. In various embodiments, a Sub-GHz ISM band RF communications module transceiver and antenna corresponding to each of audio rendering devices 210 and 220 may allow these devices to communicate with each other, and possibly to other devices via a message/packet stream, such as message/packet stream 240. The Sub-GHz ISM band connection between multiple such devices may allow for timestamps and/or timecodes to be sent directly between the devices, as described with reference to FIG. 1. The Sub-GHz ISM band connection that includes message/packet stream 240 may be referred to as a side-channel, a feedback channel, and/or an auxiliary synchronization back channel between the audio rendering devices 210 and 220. The microcontroller in each of the audio rendering devices 210 and 220 can use these timestamps and/or timecodes to determine any local clock error and to determine any adjustment needed to the local clock of the respective receiving device. In this way, the sub-GHz ISM band connection may be used to synchronize clocks of devices throughout a network, such as devices throughout the WLAN.

As described above, in various embodiments, multiple audio rendering devices, such as audio rendering devices 210 and 220, may use the NTP, TSF, timecode/timestamp, and/or similar such information in any of message/packet streams 232, 234, 240, and/or the like to play an audio stream in synchrony.

Figure 3:
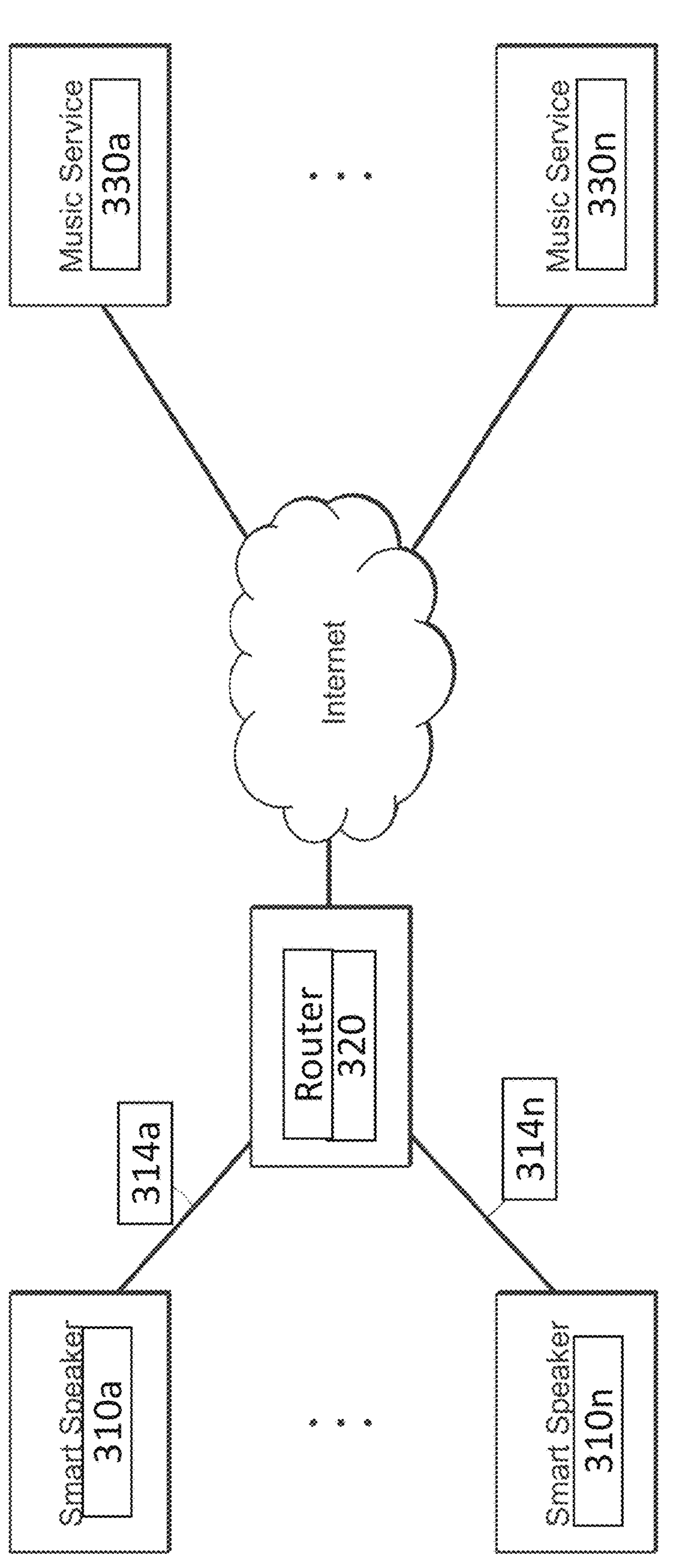
FIG. 3 depicts aspects of a system for synchronizing multiple audio rendering devices, which is similar to the system in FIG. 2, in accordance with various embodiments.

FIG. 3 depicts aspects of system 300 for synchronizing multiple audio rendering devices, which is similar to system 200. In various embodiments, system 300 may include audio rendering devices 310*a*, 310*b*, . . . 310*n*, such as smart speakers, where n may be any natural number. In various embodiments, audio rendering devices 310*a*, 310*b*, . . . 310*n* may be connected to a router 320 via wired or wireless communications connections 314*a*, 314*b*, . . . 314*n*, respectively. In various embodiments, any one of audio rendering devices 310*a*, 310*b*, . . . 310*n* may access the Internet via router 320 in order to receive audio data from online music services 330*a*, 330*b*, . . . , 330*n* (e.g., Spotify™ and Amazon Music™). In various embodiments, any one of audio rendering devices 310*a*, 310*b*, . . . 310*n* may access the Internet via a tethering connection to another one of audio rendering devices 310*a*, 310*b*, . . . 310*n* in order to receive music streams from online music services. In various embodiments, a router 320 may be a WiFi router, as described herein, and any of connections 314*a*, 314*b*, . . . 314*n* may be WiFi connections, as described herein. In various embodiments, any of audio rendering devices 310*a*, 310*b*, . . . , 310*n* may be connected to each other via a wired or wireless connection, such as via a UWB connection and/or via a Sub-GHz ISM band connection, as described herein.

In various embodiments, audio data may be provided to one or more of audio rendering devices 310*a*, 310*b*, . . . 310*n* via one or more of the communications connections 314*a*, 314*b*, . . . 314*n*. For example, audio data may be provided to audio rendering devices 310*a*, 310*b*, . . . 310*n* via a WiFi connection or by a UWB connection. In various embodiments, NTP, TSF, PTP, TSN, timestamp, timecode, or other synchronization information may be provided to one or more of audio rendering devices 310*a*, 310*b*, . . . 310*n* via one or more of the communications connections 314*a*, 314*b*, . . . , 314*n*. For example, NTP, TSF, PTP, or TSN may be provided to one or more of audio rendering devices 310*a*, 310*b*, . . . 310*n* via a WiFi connection from router 320. As another example, timestamp and/or timecode data, used for synchronizing devices, may be provided to one or more of audio rendering devices 310*a*, 310*b*, . . . 310*n* directly via a Sub-GHz ISM band connection from another one of audio rendering . . . devices 310*a*, 310*b*, . . . 310*n*.

Figure 4:
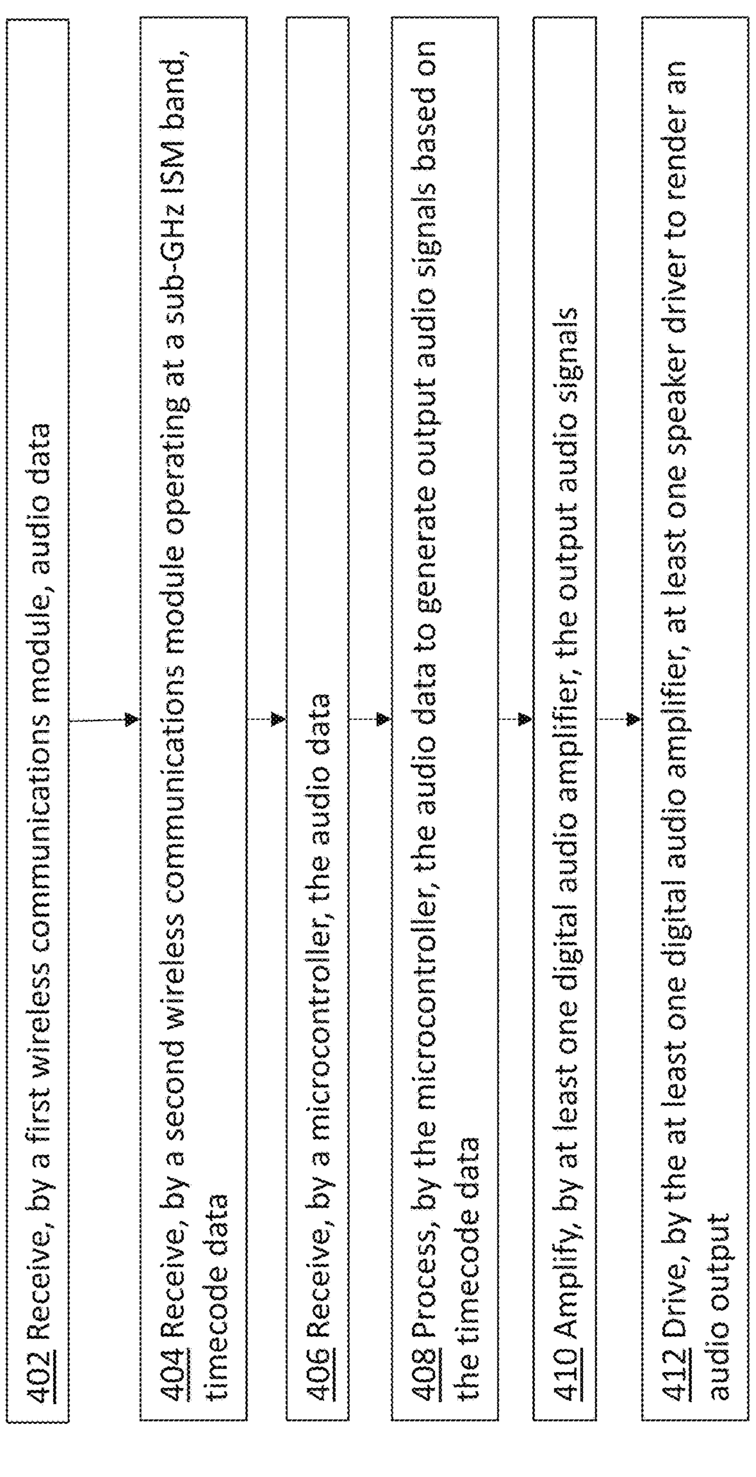
FIG. 4 shows a flow chart depicting a method of rendering synchronized audio output according to various embodiments of the present disclosure.

FIG. 4 shows a flow chart depicting a method 400 of rendering synchronized audio output according to various embodiments of the present disclosure. At step 402, audio data is received by a first wireless communications module. At step 404, timecode data is received by a second wireless communications module operating at a sub-GHz ISM band. At step 406, the audio data is received by a microcontroller. At step 408, the audio data is processed by the microcontroller to generate output audio signals based on the timecode data. At 410, the output audio signals are amplified by at least one digital audio amplifier. At 412, at least one speaker driver is driven, by the at least one digital audio amplifier, to render an audio output.

The systems and techniques, as described herein, may have many advantages over conventional systems and techniques. In particular, the devices and techniques described herein may provide more reliable and higher-resolution audio rendering, as compared to conventional systems and techniques. The devices and techniques may be capable of rendering two or more channels of audio data streams that are better synchronized (i.e., without perceptible inter-channel clock or phase drift), in a wider variety of operating environments, and at a lower cost, as compared to conventional systems and techniques. Additionally, as compared to conventional systems and techniques, the devices and techniques presented herein may allow for rapid and seamless integration and use with existing systems and techniques for rendering audio.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer-readable program instructions.

These computer-readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the function/act specified in the flowchart and/or block diagram block or blocks.

The computer-readable program instructions may also be loaded onto a computer, other programmable data processing apparatus, or other device to cause a series of operational steps to be performed on the computer, other programmable apparatus or other device to produce a computer-implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the disclosed subject matter is described herein in terms of certain preferred embodiments, those skilled in the art will recognize that various modifications and improvements may be made to the disclosed subject matter without departing from the scope thereof. Moreover, although individual features of one embodiment of the disclosed subject matter may be discussed herein or shown in the drawings of the one embodiment and not in other embodiments, it should be apparent that individual features of one embodiment may be combined with one or more features of another embodiment or features from a plurality of embodiments.

In addition to the specific embodiments claimed below, the disclosed subject matter is also directed to other embodiments having any other possible combination of the dependent features claimed below and those disclosed above. As such, the particular features presented in the dependent claims and disclosed above can be combined with each other in other manners within the scope of the disclosed subject matter such that the disclosed subject matter should be recognized as also specifically directed to other embodiments having any other possible combinations. Thus, the foregoing description of specific embodiments of the disclosed subject matter has been presented for purposes of illustration and description. It is not intended to be exhaustive or to limit the disclosed subject matter to those embodiments disclosed.

It will be apparent to those skilled in the art that various modifications and variations can be made in the method and system of the disclosed subject matter without departing from the spirit or scope of the disclosed subject matter. Thus, it is intended that the disclosed subject matter include modifications and variations that are within the scope of the appended claims and their equivalents.

What is claimed is:

1. A networked audio rendering device, comprising:

a real-time local clock;

a first wireless communications module configured to send and receive audio and synchronization data to and from a WiFi router comprising a crystal clock source;

a second wireless communications module configured to send and receive timecode data to and from at least one other networked audio rendering device, the second wireless communication module operating at a sub-GHz ISM band;

a microcontroller configured to receive and process the audio data to generate output audio signals based on timecode data for synchronizing the real-time clock with the crystal clock source of the WiFi router and with a real-time local clock of the at least one other networked audio rendering device, wherein the first wireless communications module and the second wireless communications module are electrically coupled to the microcontroller;

at least one speaker driver; and at least one digital audio amplifier, the at least one digital audio amplifier configured to:

amplify the output audio signals, and drive the at least one speaker driver to render an audio output, wherein the at least one digital audio amplifier is electrically coupled to the microcontroller and the at least one speaker driver.

2. The networked audio rendering device of claim 1, wherein the first wireless communications module is a WiFi communications module or an ultra-wideband (UWB) communications module.

3. The networked audio rendering device of claim 2, wherein the first wireless communications module is a WiFi communications module.

4. The networked audio rendering device of claim 1, wherein the first wireless communications module is configured to receive device synchronization information based on a Time Synchronization Function (TSF).

5. The networked audio rendering device of claim 1, wherein the timecode data is used to synchronize audio outputs of a plurality of networked audio rendering devices.

6. The networked audio rendering device of claim 1, wherein the microcontroller is configured to adjust the output audio signals based on the timecode data.

7. The networked audio rendering device of claim 6, wherein the microcontroller is configured to adjust a phase-locked loop (PLL) within the networked audio rendering device based on the timecode data.

8. The networked audio device of claim 7, wherein an adjusted phase-locked loop (PLL) comprises a delayed or sped up PLL output frequency obtained by filtering the timecodes received by the second wireless communications module and eliminating timecodes outside of an averaged mean timecode value.

9. The networked audio rendering device of claim 6, wherein the microcontroller is configured to delay or speed up the output audio signals based on the timecode data.

10. The networked audio rendering device of claim 6, wherein the microcontroller is configured to synchronize the output audio signals with output audio signals of another networked audio rendering device based on the timecode data.

11. A system for rendering synchronized audio output, the system comprising:

a first audio rendering device configured to render a first audio output, the first audio rendering device comprising:

a first real-time local clock;

a first wireless communications module configured to send and receive first audio data and synchronization data to and from a WiFi router comprising a crystal clock source;

a second wireless communications module configured to send and receive timecode data to and from a second audio rendering device, the second wireless communication module operating at a sub-GHz ISM band;

a first microcontroller configured to receive and process the first audio data to generate first output audio signals based on the timecode data for synchronizing the first real-time local clock with the crystal clock source of the WiFi router and with a second real-time local clock of the second audio rendering device, wherein the first wireless communications module and the second wireless communications module are electrically coupled to the first microcontroller;

at least one first speaker driver;

at least one first digital audio amplifier, the at least one first digital audio amplifier configured to:

amplify the first output audio signals, and drive the at least one first speaker driver to render the first audio output, wherein the at least one first digital audio amplifier is electrically coupled to the first microcontroller and the at least one first speaker driver; and the second audio rendering device configured to render a second audio output, the second audio rendering device comprising:

the second real-time local clock;

a third wireless communications module configured to send and receive second audio data and synchronization data to and from the WiFi router;

a fourth wireless communications module configured to send and receive the timecode data from the second wireless communications module of the first audio rendering device, the fourth wireless communication module operating at a sub-GHz ISM band;

a second microcontroller configured to receive and process the second audio data to generate second output audio signals based on the timecode data for synchronizing the second real-time local clock with the local clock of the WiFi router and with the first real-time local clock of the first audio rendering device, wherein the third wireless communications module and the fourth wireless communications module are electrically coupled to the second microcontroller;

at least one second speaker driver; and at least one second digital audio amplifier, the at least one second digital audio amplifier configured to:

amplify the second output audio signals, and drive the at least one second speaker driver to render the second audio output, wherein the first audio output and the second audio output are synchronized, wherein the at least one second digital audio amplifier is electrically coupled to the second microcontroller and the at least one second speaker driver.

12. The system of claim 11, wherein the first wireless communications module is a WiFi communications module or an ultra-wideband (UWB) communications module, and wherein the third wireless communications module is a WiFi communications module or an ultra-wideband (UWB) communications module.

13. The system of claim 12, wherein the first wireless communications module is a WiFi communications module, and wherein the third wireless communications module is a WiFi communications module.

14. The system of claim 11, wherein the first wireless communications module is configured to receive device synchronization information based on a Time Synchronization Function (TSF), and wherein the third wireless communications module is configured to receive device synchronization information based on a TSF.

15. The system of claim 11, wherein the second microcontroller is configured to adjust the second output audio signals based on the timecode data.

16. The system of claim 15, wherein the second microcontroller is configured to adjust a phase-locked loop (PLL) within the second audio rendering device based on the timecode data.

17. The system of claim 16, wherein an adjusted phase-locked loop (PLL) comprises a delayed or sped up PLL output frequency obtained by filtering the timecodes received by the second wireless communications module and eliminating timecodes outside of an averaged mean timecode value.

18. The system of claim 15, wherein the second microcontroller is configured to delay or speed up the second output audio signals based on the timecode data.

19. A method of rendering synchronized audio output, comprising:

sending and receiving, by a first wireless communications module, audio data and synchronization data to and from a WiFi router comprising a crystal clock source;

sending and receiving, by a second wireless communications module operating at a sub-GHz ISM band, timecode data to and from at least one other networked audio rendering device;

receiving, by a microcontroller, the audio data;

processing, by the microcontroller, the audio data to generate output audio signals based on the timecode data to synchronize a real-time local clock with the crystal clock source of the WiFi router and with a real-time local clock of the at least one other networked audio rendering device;

amplifying, by at least one digital audio amplifier, the output audio signals; and driving, by the at least one digital audio amplifier, at least one speaker driver to render an audio output.

20. The method of claim 19, further comprising receiving, by the first wireless communications module, device synchronization information based on a Time Synchronization Function (TSF).

21. The method of claim 19, further comprising synchronizing audio outputs of a plurality of networked audio rendering devices based on the timecode data.

22. The method of claim 19, further comprising adjusting, by the microcontroller, the output audio signals based on the timecode data.

23. The method of claim 19, further comprising adjusting, by the microcontroller, a phase-locked loop (PLL) based on the timecode data.

24. The method of claim 23, wherein adjusting a phase-locked loop (PLL) comprises:

filtering the timecodes received by the second wireless communications module;

eliminating timecodes outside of an averaged mean timecode value;

delaying or speeding up the PLL output frequency of the networked audio rendering device.

25. The method of claim 19, further comprising delaying or speeding up, by the microcontroller, the output audio signals based on the timecode data.

* * * * *